United States Patent [19]

Golio et al.

[11] Patent Number: 5,005,059
[45] Date of Patent: Apr. 2, 1991

[54] DIGITAL-TO-ANALOG CONVERTING FIELD EFFECT DEVICE AND CIRCUITRY

[75] Inventors: John M. Golio; Joseph Staudinger, both of Chandler, Ariz.

[73] Assignee: Motorola, Inc., Schaumburg, Ill.

[21] Appl. No.: 345,746

[22] Filed: May 1, 1989

[51] Int. Cl.$^5$ .................. H01L 29/80; H01L 29/78; H03K 3/01
[52] U.S. Cl. ................... 357/22; 357/23.14; 307/296.1
[58] Field of Search .......... 357/23.14, 22 H

[56] References Cited

U.S. PATENT DOCUMENTS

| | | | |
|---|---|---|---|
| 3,969,745 | 7/1976 | Blocker, III | 357/23.14 |
| 4,684,965 | 8/1987 | Tajima et al. | 357/22 H |
| 4,734,751 | 3/1988 | Hwang et al. | 357/22 H |
| 4,864,162 | 9/1989 | Maoz | 307/296.1 |

Primary Examiner—Rolf Hille
Assistant Examiner—Robert P. Limanek
Attorney, Agent, or Firm—Maurice J. Jones

[57] ABSTRACT

A field effect device and circuit suitable for providing an analog output signal having a magnitude which is representative of a digital input code having a sequence of bits. The device includes a plurality of gate electrodes located between an input electrode and an output electrode. The gate electrodes have unequal lengths to provide different gate widths each representative of the magnitude of a portion of an analog signal provided at the output electrode in response to a digital signal of a particular logic state, such as a logical "one", when applied to any one of the gate electrodes. Thus, the magnitude of the current conducted between the input electrode and the output electrode is responsive to the sum of the widths of the gates receiving the digital signal of a particular logic state.

18 Claims, 3 Drawing Sheets

DIGITAL-TO-ANALOG CONVERTING FIELD EFFECT DEVICE AND CIRCUITRY

BACKGROUND OF THE INVENTION

The subject invention generally relates to Digital-to-Analog (D-to-A) converters and particularly to D-to-A converters each employing only a single field effect device.

Present day electronic applications often require that analog signals be provided in response to digital codes. Such analog signals might have magnitudes that are representative of the digital codes, for example. More specifically, an analog signal of a particular magnitude might be required in response to a digital code or number of 001, for instance. The magnitude of the analog signal might further be required to progressively increase as the digital number increases, for instance, as follows: 010, 011, 111, etc. Monolithic Microwave Integrated Circuits (MMIC) applications utilizing gallium arsenide semiconductor material require such D-to-A circuits. D to A converter circuits are utilized in a multitude of applications including those for communications systems, satellites, computers, control systems, etc.

Prior art D-to-A converter circuits often include a plurality of active and/or passive devices in either discrete or integrated circuit form. Such converters therefore tend to be too expensive to fabricate, take up too much space, and/or have an unduly high failure rate for some applications. Also, some complex prior art D-to-A circuits tend to operate too slowly for some requirements.

SUMMARY OF THE INVENTION

Accordingly, it is an object of the present invention to provide D-to-A converters which are capable of high speed operation.

Another object of the invention is to provide single device, D-to-A converter circuits.

An embodiment of the invention relates to a field effect device suitable for providing an analog output signal having a magnitude which is representative of a digital input code having a sequence of bits. The device includes a plurality of gate electrodes located between input and output electrodes. The gate electrodes provide different gate widths. Each gate width is representative of the magnitude of a portion of the analog signal provided at the output electrode in response to a digital signal of a particular logic state, such as a logical "one", when applied to the gate electrode. At any particular time, the magnitude of the total current conducted between the input and output electrodes is responsive to the sum of the widths of the gates receiving the digital signal of the particular logic state rendering the associated portions of the device conductive.

The field effect device can be utilized in a circuit for receiving the digital code having a plurality of bits representing a number ranging from a least significant bit to a most significant bit. The gate for receiving the least significant bit has the smallest gate width and the widths of the other gates can be multiples of the smallest gate width so that all the gates are adapted to allow currents having predetermined magnitudes to flow between the input and output electrodes, in response to the digital signals of the particular logic state.

BRIEF DESCRIPTION OF THE DRAWING

A more complete understanding of the present invention may be derived by reference to the detailed description and the claims when considered along with the accompanying drawings wherein like reference numbers designate similar parts.

DETAILED DESCRIPTION OF THE PREFERRED EMBODIMENT

Figure 1:
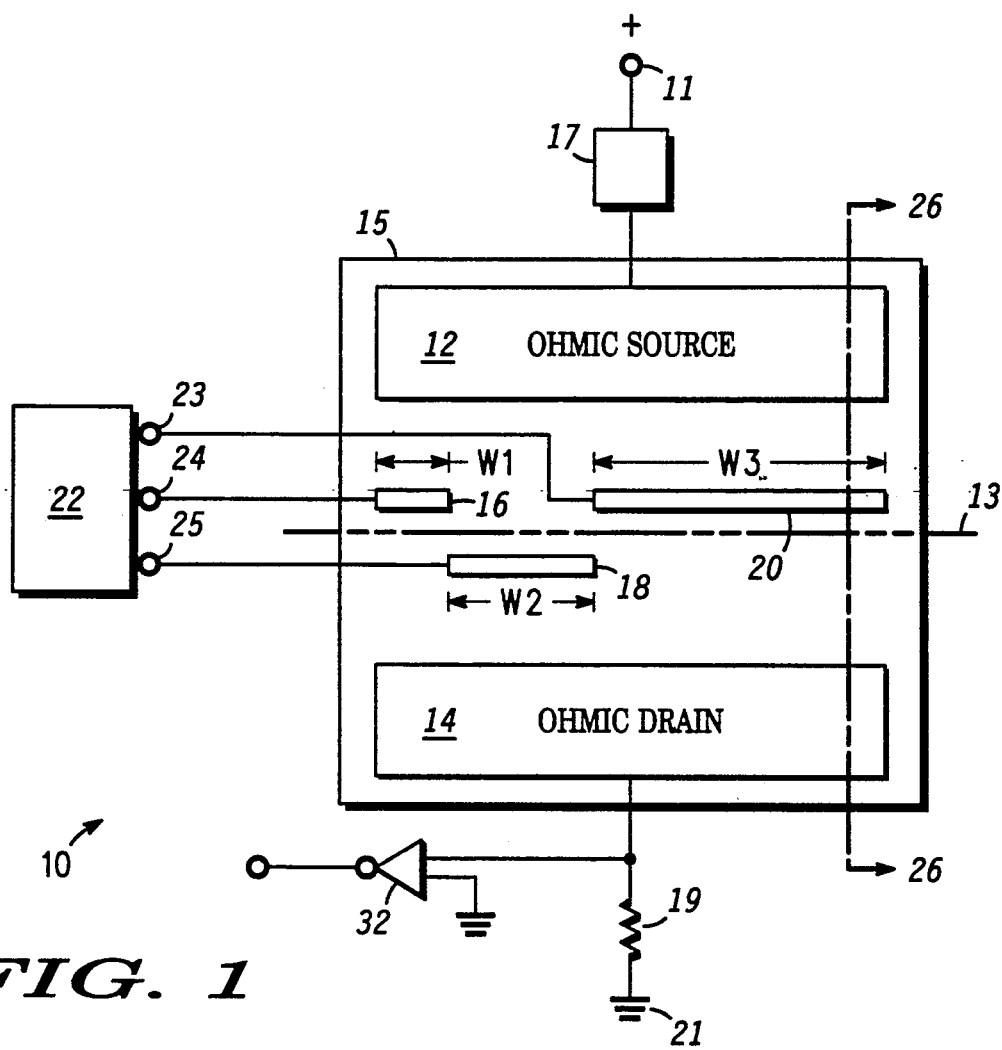
FIG. 1 is a circuit diagram of a D-to-A converter showing connections to a Metal Semiconductor Field Effect Transistor (MESFET) top structure.

FIG. 1 is a diagram of the top structure of a Digital-to-Analog Converting Field-Effect Transistor (DACFET) 10 which is manufacturable in semiconductor material such as gallium arsenide. DACFET 10 converts digital input signals which can be in the form of digitally encoded numbers, into corresponding analog output signals. The analog signals can be either voltages or currents, for instance, which have magnitudes proportional to the magnitudes represented by the bits of digitally encoded numbers. Device 10 can be fabricated using known field effect technologies including Metal Semiconductor FET (MESFET), Metal Oxide Semiconductor FET (MOSFET), Junction FET (JFET) and/or Metal Insulator FET (MISFET).

More specifically, FIG. 1 illustrates the layout of the top contacts and semiconductor surface for a 3-bit D-to-A converting MESFET device 10. Device 10 includes ohmic non-rectifying contacts 12 and 14 to the semiconductor material 15 through which an analog current flows. Schottky rectifying contacts of gate electrodes 16, 18 and 20 are provided to semiconductor material 15 substantially along common axis 13. The semiconductor material underlying contact 12 provides a source region and the semiconductor material underlying contact 14 provides a drain region.

The semiconductor material underlying gate metalizations indicated by reference numbers 16, 18 and 20, provide gate regions. At any particular instant in time each of these gate structures will be responsive to whether a digital "1" or a digital "0" is applied thereto. Gate 16 of width, $W_1$ responds to the least significant bit of information and gate 18 of width, $W_2$ responds to the second least significant bit. Gate 20 of width, $W_3$ responds to the most significant bit. Device 10 along with source 12 and drain 14 can be elongated in either direction along axis 13 to facilitate the addition of further gates having greater widths between source 12 and drain 14 electrodes if the conversion of a higher number of bits is desired.

Gate electrodes 16, 18 and 20 will generally be biased at one of two possible levels, except during switching times. An input level or particular logic state corresponding to one digital state, for instance, will allow maximum current to flow beneath the gate to which it is applied. This is referred to as an "on-state". Another bias level corresponding to the other digital state for the bit will not allow current to flow beneath the gate. This is referred to as the "off-state". The total device current at any instant in time is the sum of the currents flowing between the source 12 and drain 14 electrodes as a result of all the "on" gates.

Bias circuit 17 of FIG. 1 is connected between positive power supply conductor 13 and source contact 12. Load 19 provides a bias return path from drain contact 14 to negative power supply conductor 21. Digital supply 22 provides the input parallel bit codes to be converted at output terminals 23, 24 and 25 which are respectively connected to gates 20, 16 and 18.

Figure 2:
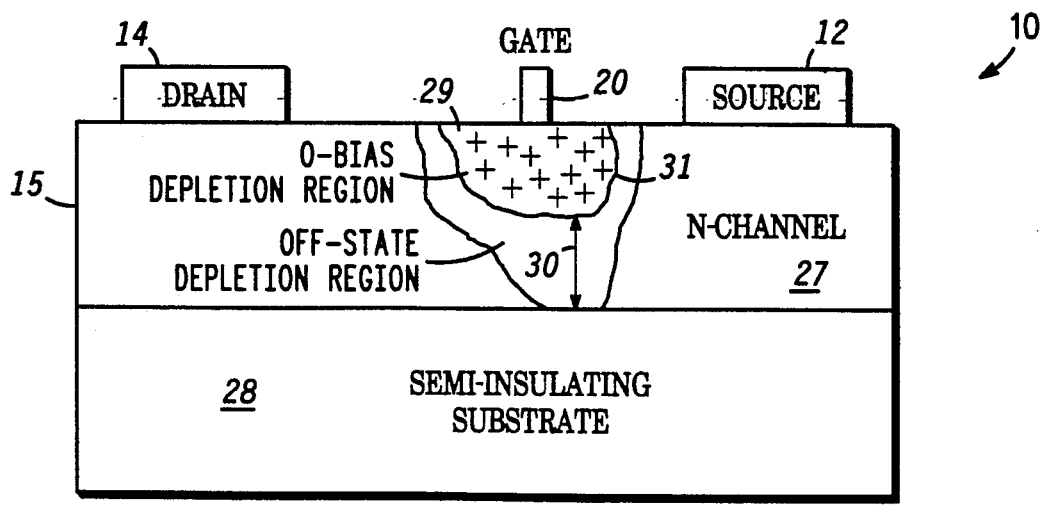
FIG. 2 is a cross-sectional view of the MESFET of FIG. 1.

FIG. 2 shows a cross-sectional end view along lines 26 of device 10 of FIG. 1. A n-channel region 27 as shown in FIG. 2, is provided on a semi-insulating substrate 28. Under normal operation, a small bias voltage is applied between the source 12 and drain 14 by bias circuit 17 and load 19 of FIG. 1. The bias induces a current to flow in device 10 between electrodes 12 and 14 for a zero potential gate signal which might correspond to a logical one "1". Under zero gate 20 bias conditions, for instance, the shallow depletion region 29 of FIG. 2 forms under gate electrode 20 leaving portion 30 of the n-channel underneath gate electrode 20 available for current flow. When a voltage is applied between source 12 electrode and drain electrode 14, current flows through semiconductor 15 between the drain and source electrodes. Hence, device 10 is normally in the "on" or conductive state. The magnitude of the current which flows beneath a particular bit gate electrode is proportional to the carrier density in n-channel 27, the undepleted channel dimension 30 and the width of the gate.

In response to an appropriate amount $V_p$ of reverse or negative gate bias voltage, which can correspond to a logical zero "0", the depletion region 29 under the Schottky barrier extends deeper into the n-channel and eliminates or pinches off the current path between the drain 12 and source 14 electrodes. Under these conditions the current flowing beneath any gate electrode receiving the logical "0" is nearly zero. The total current flowing between electrodes 12 and 14 can be expressed as:

$$I_{total} = I_1 X (S_1 W_1 + S_2 W_2 + S_3 W_3)$$

where $S_n = $ "1" or "0" corresponding to whether the nth bit is a logical "1" or a logical "0". $I_1$ is a constant given in terms of current per unit width which is dependent on semiconductor processing parameters.

If the active semiconductor region of device 10 of FIG. 2 only extended to bottom edge 31 of depletion region 29, then device 10 would be normally off or nonconductive. Device 10 then could then be selectively turned on by positive binary signal voltages applied to the desired gates.

To accomplish D-to-A conversion, the gate electrode widths, W, shown in FIG. 1 can be scaled in the following manner:
(a) the width $W_1$, of gate electrode 16, corresponding to the least significant digital bit, is chosen to be just large enough so that the current which flows beneath it is easily measurable;
(b) the width $W_2$, of gate electrode 18, corresponding to the next least significant digital bit, is twice the magnitude of the gate width, $W_1$, corresponding to the least significant bit; and
(c) each gate width corresponding to a higher significant digital bit is twice the value of the next bit gate width corresponding to the next least significant digital bit.

As an example, the 3-bit converter device 10 shown in FIG. 1 could have $W_1$ equal to 2 microns, $W_2$ equal to 4 microns and $W_3$ equal to 8 microns.

The following table, wherein the gate voltage $V_p$ is the device "pinch off" voltage or logical "0" and $I_o$ is the maximum current with all gates turned on in response to a zero gate bias voltage which is a logical "1", illustrates the operation of DACFET 10.

| Digital Code | | | Voltage Applied | | | Current Flowing | Analog Represen- |
| $2^0$ | $2^1$ | $2^2$ | G1 | G2 | G3 | From Source to Drain | tation |
| --- | --- | --- | --- | --- | --- | --- | --- |
| 1 | 1 | 1 | 0 | 0 | 0 | $I_o$ | 7 |
| 0 | 1 | 1 | $V_p$ | 0 | 0 | $6/7\ I_o$ | 6 |
| 1 | 0 | 1 | 0 | $V_p$ | 0 | $5/7\ I_o$ | 5 |
| 0 | 0 | 1 | $V_p$ | $V_p$ | 0 | $4/7\ I_o$ | 4 |
| 1 | 1 | 0 | 0 | 0 | $V_p$ | $3/7\ I_o$ | 3 |
| 0 | 1 | 0 | $V_p$ | 0 | $V_p$ | $2/7\ I_o$ | 2 |
| 1 | 0 | 0 | 0 | $V_p$ | $V_p$ | $1/7\ I_o$ | 1 |
| 0 | 0 | 0 | $V_p$ | $V_p$ | $V_p$ | 0 | 0 |

As indicated in the last two columns of the foregoing table, the magnitude of the source-to-drain current is representative of the magnitude indicated by the digital code input of the first column. This current can be conducted by load resistor 19 to provide a voltage output. Moreover, an inverter 32 can be connected to load resistor 19, as shown in FIG. 1, to reverse the logic so that a gate voltage of $V_p$ becomes a "1" and zero gate voltage becomes a "0".

Figure 3:
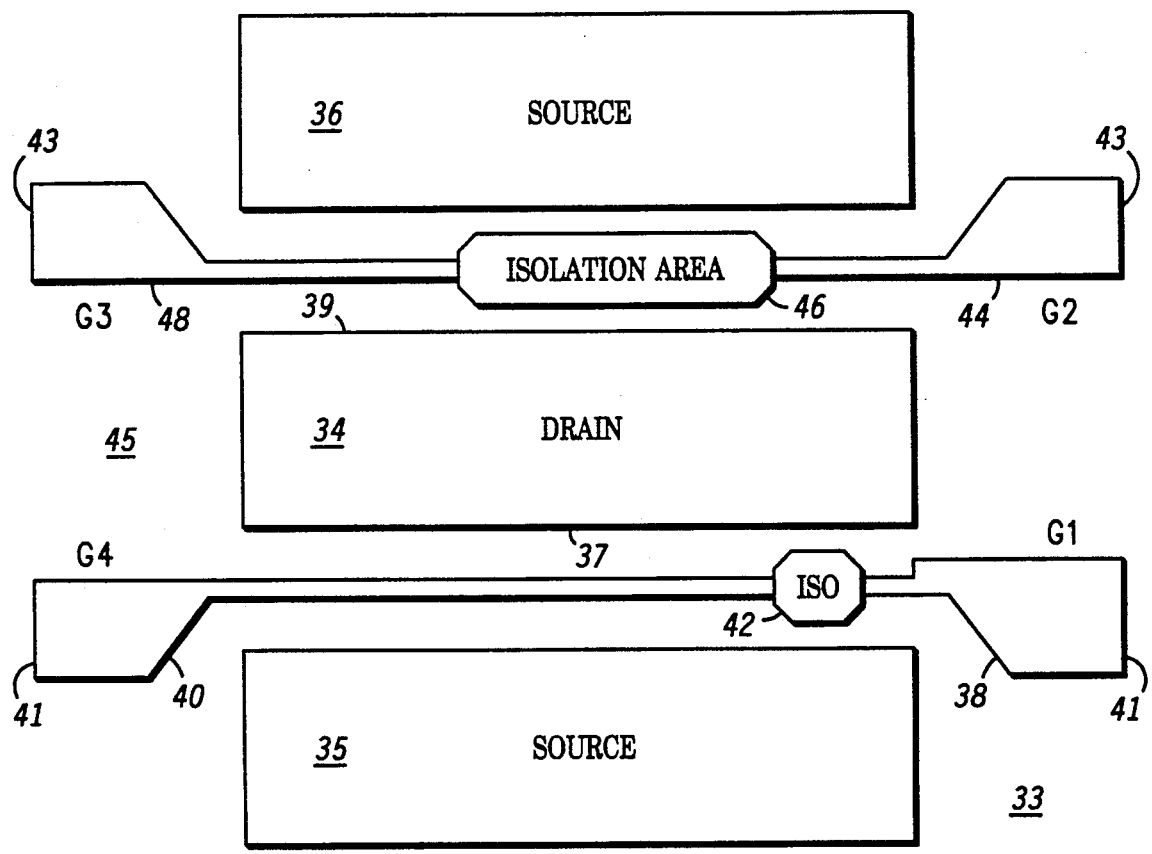
FIG. 3 shows a top view of a Field Effect Transistor (FET) having another configuration.

FIG. 3 illustrates a top view of an alternative and perhaps more practical way for some applications for realizing a 4-bit DACFET device 33. A rectangular ohmic drain 34 is shown as being separated from rectangular ohmic source 35 and rectangular ohmic source 36. Source 35 is juxtapositioned along side 37 of drain 34 and source 36 is juxtapositioned along side 39 of drain 34. First gate 38 corresponding to the least significant bit and a fourth gate 40 corresponding to the most significant bit are juxtapositioned between side 37 of drain 34 and source 35. Gate electrodes 38 and 40 are arranged along an axis 41. Isolation area 42 separating gate electrodes 38 and 40 is a region of semiconductor which has been neutralized to prevent current flow by a boron implant, for instance. Moreover, the next least significant bit gate electrode 44 is separated by isolation area 46 from the second most significant bit gate electrode 48. Gate electrodes 44 and 48 are located along axis 43 and generally juxtapositioned between source 36 and side 39 of drain 34. Areas 38,40,44 and 48 indicate the metalization pattern for the corresponding gate electrodes. Handling capability for higher numbers of bits are easily added to the configuration shown in FIG. 3 by adding addition drain and source terminals juxtapositioned next to each other with isolated or separated gate electrodes located therebetween. The source and drain electrodes of FIGS. 1 and 3 can be interchanged so that the source becomes the drain and vice versa. Electrodes 34,35,36,38,40,42,44 and 48 are separated from each other by semiconductor material 45.

Figure 4:
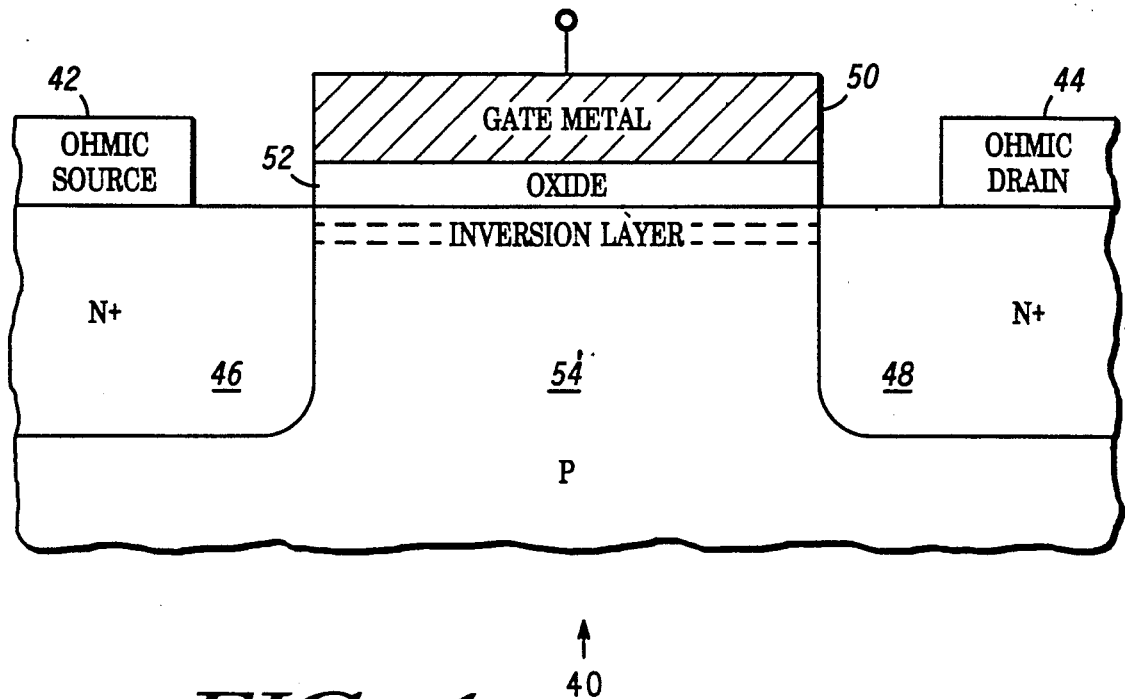
FIG. 4 is a cross section of a Metal Oxide Semiconductor Field Effect Transistor (MOSFET)

FIG. 4 illustrates the cross section of device 49 which can have the same topography as either device 10 shown in FIG. 1 or device 33 of FIG. 3, but which is fabricated using MOSFET technology. Device 49 includes ohmic source electrode 51 and ohmic drain electrode 55 respectively overlying n+ portions of regions 56 and 58. Gate electrode metal 50 is separated by insulating layer 52 from the p-type semiconductor material 54. Device 49 is normally nonconductive in response to zero gate bias applied to conductor 50. A positive bias or "turn on" voltage on gate electrode 50 tends to create an accumulation region which forms a conductive path through p material 54 between n+ regions 56 and 58 thereby rendering device 49 conductive. The magnitude of the total current conducted between source 51 and drain 55 is proportional to the widths of the gates simultaneously receiving the "turn on" voltage.

Figure 5:
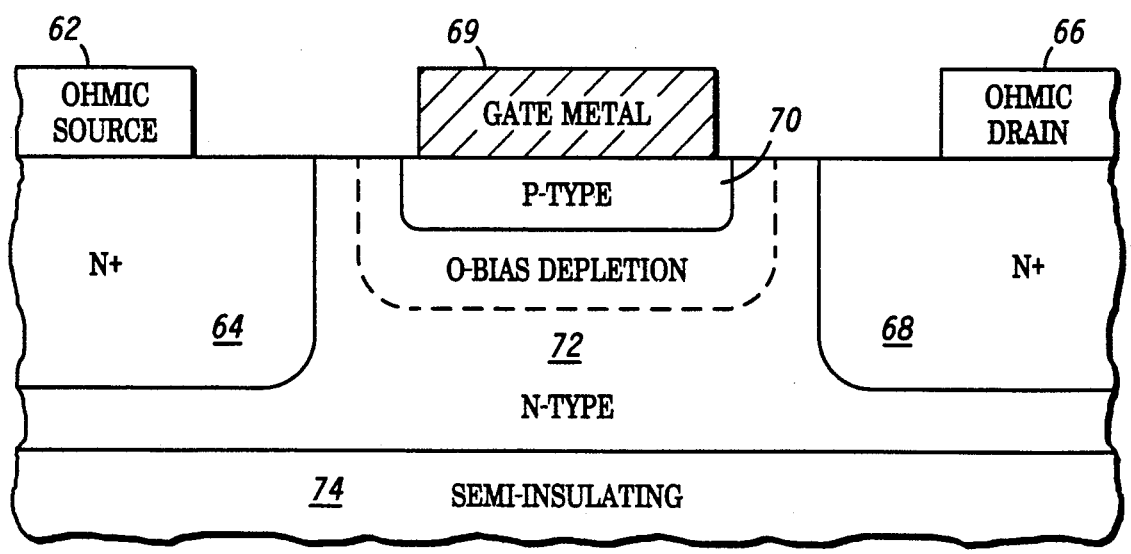
FIG. 5 is a cross section of a Junction Field Effect Transistor (JFET).

FIG. 5 indicates a cross section of JFET device 60 which also can have the topography of either device 10 of FIG. 1 or device 33 of FIG. 3. Device 60 includes an ohmic source metalization 62 overlying n+ region 64 and an ohmic drain conductor 66 overlying n+ region 68. Gate metal 69 overlies part of p-type region 70 provided in n-type material 72. Semi-insulating substrate 74 underlies semiconductor material 72.

DACFETs which are suitable for being provided in gallium arsenide semiconductor material useful in MMIC applications have been described. These devices are manufacturable by known semiconductor processes involving diffusion, growing, implanting, etc. Single device configurations have been described which are useful for performing D-to-A conversions. The above-described DACFETs take up a minimum amount of space and are operable at very high frequencies because switching times of only tens of picoseconds are required.

While the invention has been particularly shown and described with reference to preferred embodiments, those skilled in the art will understand that changes in form and details may occur therein without departing from the scope of the present invention.

We claim:

1. A field effect device suitable for providing an analog output signal having a magnitude which is representative of a digital input code having a sequence of bits, the field effect device including in combination:
    an input electrode;
    an output electrode;
    a plurality of gate electrodes located between said input electrode and said output electrode, said gate electrodes providing different gate widths, each of said gate widths being representative of the magnitude of the analog signal to be provided at said output electrode in response to a digital input signal of a particular logic state to be applied to said gate electrode;
    means for applying selected digital bits separately to each of said gate electrodes to independently control each of said gate electrodes; and
    the magnitude of the current conducted between said input electrode and said output electrode thereby being adapted to be responsive to the total of the widths of the gates receiving said digital signal of said particular logic state.

2. The field effect device of claim 1 wherein:
    the digital input code includes a plurality of bits representing a number ranging from a least significant bit to a most significant bit; and
    one of said gate electrodes being adapted to receive said least significant bit, said one said gate electrode providing a gate having the smallest gate width; and
    said widths of said others gates being multiples of said smallest gate width, all of said gates thereby being adapted to selectively allow currents to flow between said input and output electrodes having predetermined magnitudes in response to receiving said digital signals of said particular logic state.

3. The field effect device of claim 2 wherein said multiple equals $2^N$ where N is a whole integer.

4. The field effect device of claim 1 being provided in a metal oxide semiconductor field effect transistor structure.

5. The field effect device of claim 1 being provided in a junction field effect transistor structure.

6. The field effect device of claim 1 being provided in a metal insulator field effect transistor structure.

7. The field effect device of claim 1 wherein:
    one of said input and output electrodes has a first side and a second side;
    said other of said input and output electrodes is juxtapositioned along said first side of said one electrode;
    a semiconductor region having a surface located between said other electrode and said first side of said one electrode; and
    said gate electrodes having different gate widths being located on said surface of said semiconductor region.

8. The field effect device of claim 7 wherein said gate electrodes are located substantially along a common axis and wherein current flows in only one direction perpendicular to said common axis.

9. The field effect device of claim 7, further including:
    a further electrode juxtapositioned along said second side of said one electrode;
    a further semiconductor region having a surface located between said second side of said one electrode and said further electrode; and
    additional gate electrodes having selected gate widths being located on said surface of said further semiconductor region.

10. A circuit for converting digital signals to analog form including:
    field effect means having a source electrode, a drain electrode and a plurality of gate electrodes;
    first power supply conductor means;
    first means coupling said first power supply conductor means to said source electrode;
    second power supply conductor means;
    second means coupling said second power supply means to said drain electrode; and
    means adapted to couple the digital signals separately to each of said gate electrodes to independently control said gate electrodes, said gate electrodes having different gate widths proportional to the magnitude of the analog signal to be provided at said drain electrode in response to a digital signal of a particular logic state applied to each of said gate electrodes.

11. The circuit of claim 10 wherein said field effect means includes:
    a further source electrode;
    a further plurality of gate electrodes located between said further source electrode and said drain electrode; and
    further means adapted to couple selected digital signals to each of said further plurality of gate electrodes.

12. The circuit of claim 10 wherein said first means includes a bias circuit.

13. The circuit of claim 10 wherein said second means includes an electrical load.

14. A field effect device suitable for providing an analog output signal having a magnitude which is representative of a digital input code having a sequence of bits, the digital input code including a plurality of bits representing a number ranging from a least significant bit to a most significant bit, the field effect device including in combination:

an input electrode;
an output electrode;
a plurality of gate electrodes located between said input electrode and said output electrode, said gate electrodes providing different gate widths, each of said gate widths being representative of the magnitude of the analog signal to be provided at said output electrode in response to a digital input signal of a particular logic state to be applied to said gate electrode, one of said gate electrodes being adapted to receive said least significant bit, said one said gate electrode providing a gate having the smallest width, said widths of said other gates being multiples of said smallest width wherein said multiple equals $2^N$ where N is a whole integer, and all of said gates thereby being adapted to selectively allow currents to flow between said input and output electrodes having predetermined magnitudes in response to receiving said digital signals of said particular logic state;
means for applying selected bits to each of said gate electrodes; and
the magnitude of the current conducted between said input electrode and said output electrode thereby being adaptive to be responsive to the total of the widths of the gates receiving said digital signal of said particular logic state.

15. The field effect device of claim 14 wherein one of said input and output electrodes has a first side and a second side;
said other said input and output electrodes is juxtapositioned along said first side of said one electrode;
a semiconductor region having a surface located between said other electrode and said first side of said one electrode; and
said gate electrodes having different widths being located on said surface of said semiconductor region.

16. A field effect device suitable for providing an analog output signal having a magnitude which is representative of a digital input code having a sequence of bits, the field device including in combination:
a first input electrode;
an output electrode;
said output electrode having a first side and a second side;
said first input electrode being juxtapositioned along said first side of said output electrode;
a first semiconductor region having a surface located between said first input electrode and said first side of said output electrode;
a first plurality of gate electrodes located on said surface of said first semiconductor region between said input electrode and said output electrode, said gate electrodes providing selected gate widths;
a second input electrode juxtapositioned along said second side of said output electrode;
a second semiconductor region having a surface located between said second side of said output electrode and said second input electrode;
a second plurality of gate electrodes having selected gate widths being located on said surface of said second semiconductor region;
means for applying selected digital bits to each of said gate electrodes;
each of said gate widths being representative of the magnitude of the analog signal to be provided at said output electrode in response to a digital input signal of a particular logic state to be applied to said gate electrode; and
the magnitude of the current conducted between said input and said output electrode thereby being adapted to be responsive to the total of the widths of the gates receiving said digital signal of said particular logic state.

17. The field effect device of claim 1, further including:
semiconductor material located under each of said gate electrodes; and
said semiconductor material under a gate electrode being rendered fully conductive in response to a digital input signal of said particular logic state being applied to the gate electrode and nonconductive in response to a digital input signal not of said particular logic state being applied to the gate electrode.

18. The circuit of claim 10, further including:
semiconductor material located under each of said gate electrodes; and
said semiconductor material under a gate electrode being rendered fully conductive in response to a digital input signal of said particular logic state being applied to the gate electrode and nonconductive in response to a digital input signal not of said particular logic state being applied to the gate electrode.

* * * * *